United States Patent
Ohnishi et al.

(10) Patent No.: US 7,060,410 B2
(45) Date of Patent: Jun. 13, 2006

(54) NOVOLAK RESIN SOLUTION, POSITIVE PHOTORESIST COMPOSITION AND PREPARATION METHOD THEREOF

(75) Inventors: Hiroyuki Ohnishi, Kawasaki (JP);
Yusuke Nakagawa, Kawasaki (JP);
Kousuke Doi, Kawasaki (JP)

(73) Assignee: Tokyo Ohka Kogyo Co., Ltd., Kawasaki (JP)

(*) Notice: Subject to any disclaimer, the term of this patent is extended or adjusted under 35 U.S.C. 154(b) by 94 days.

(21) Appl. No.: 10/414,257

(22) Filed: Apr. 15, 2003

(65) Prior Publication Data
US 2004/0081909 A1   Apr. 29, 2004

(30) Foreign Application Priority Data
Apr. 22, 2002 (JP) .............................. 2002-119501
May 16, 2002 (JP) .............................. 2002-141597

(51) Int. Cl.
*G03F 7/023* (2006.01)
(52) U.S. Cl. ...................... 430/189; 430/191; 430/192; 430/193
(58) Field of Classification Search ................ 430/189, 430/191, 192, 193; 529/155; 528/155
See application file for complete search history.

(56) References Cited

U.S. PATENT DOCUMENTS

| | | | |
|---|---|---|---|
| 3,868,254 A * | 2/1975 | Wemmers | 430/165 |
| 4,107,229 A * | 8/1978 | Tideswell et al. | 525/502 |
| 4,814,365 A * | 3/1989 | Takiyama et al. | 523/514 |
| 4,855,333 A | 8/1989 | Rudik et al. | 522/71 |
| 6,103,443 A * | 8/2000 | Wanat et al. | 430/191 |
| 6,194,491 B1 * | 2/2001 | Fujii et al. | 523/466 |
| 6,271,284 B1 | 8/2001 | Archibald et al. | 523/142 |
| 6,441,060 B1 * | 8/2002 | Hendershot et al. | 523/142 |
| 6,830,872 B1 * | 12/2004 | Mizutani et al. | 430/276.1 |

FOREIGN PATENT DOCUMENTS

| | | |
|---|---|---|
| JP | HEI 07-248619 A | 9/1995 |
| JP | 10232489 A | 9/1998 |
| JP | HEI 10-232489 A | 9/1998 |

OTHER PUBLICATIONS

JP-10232489 English Abstract.*
JP-07-248619 English Abstract.*

* cited by examiner

*Primary Examiner*—John S. Chu
(74) *Attorney, Agent, or Firm*—Hoffmann & Baron, LLP

(57) ABSTRACT

There is provided a method of producing a resist composition which yields a resist composition with good storage stability, and no fluctuation in characteristics between production lots. There are provided: a novolak resin solution formed by adding benzoquinone to a novolak resin solution produced by dissolving a novolak resin in an organic solvent; a positive photoresist composition comprising the novolak resin solution and a photosensitive component; a positive photoresist composition comprising the novolak resin solution, a photosensitive component, and hydroquinone; and a method of producing a positive photoresist composition involving mixing the novolak resin solution described above and a photosensitive component.

3 Claims, No Drawings

NOVOLAK RESIN SOLUTION, POSITIVE PHOTORESIST COMPOSITION AND PREPARATION METHOD THEREOF

This application claims priority based on Japanese Patent Application No. 2002-119501, filed on Apr. 22, 2002, and Japanese Patent Application No. 2002-141597, filed on May 16, 2002.

BACKGROUND OF THE INVENTION

1. Field of the Invention

The present invention relates to a novolak resin solution, a positive photoresist composition, and a method of producing the same.

2. Description of the Related Art

Photoresists comprising an alkali soluble resin and a quinonediazide group containing compound display excellent resolution, sensitivity, etching resistance and heat resistance in photolithography techniques utilizing i-line radiation (365 nm), and are consequently widely used in the production of semiconductor elements and liquid crystal elements.

However, positive photoresist compositions comprising an alkali soluble resin, typified by novolak resins, and a quinonediazide group containing compound typified by quinonediazide ester compounds may deteriorate over time following production, leading to variations in the resist characteristics such as the sensitivity and the resolution. In order to prevent this type of deterioration over time, various corrective actions are taken, including adding deterioration prevention agents, and storing the prepared resist composition in a cold, dark place, under an inert atmosphere.

Furthermore, Japanese Unexamined Patent Application, First Publication No. Hei 7-248619 discloses a positive photoresist composition with excellent storage stability and resistance to the formation over time of foreign matter, which is produced by adding an acidic compound such as p-toluenesulfonic acid or acetic acid to a resist composition.

In addition, Japanese Unexamined Patent Application, First Publication No. Hei 10-232489 discloses a method of preventing variations in the quality of a resist composition resulting from reduction of the quinonediazide type photosensitizer by adding a reduction prevention agent such as benzoquinone or naphthoquinone to the resist composition.

However, when investigated by the inventors of the present invention, it became evident that variations in the quality of resist compositions to which the methods of either Japanese Unexamined Patent Application, First Publication No. Hei 7-248619 or Japanese Unexamined Patent Application, First Publication No. Hei 10-232489 had been applied, could not always be prevented. In other words, it was clear that even for a single product, fluctuations could occur in the characteristics of the product between production lots.

SUMMARY OF THE INVENTION

Accordingly, an object of the present invention is to provide a method of producing a resist composition which yields a resist composition with good storage stability, and no fluctuation in characteristics between production lots.

The inventors of the present invention surmised that in the methods disclosed in Japanese Unexamined Patent Application, First Publication No. Hei 7-248619 and Japanese Unexamined Patent Application, First Publication No. Hei 10-232489, deterioration of the photosensitizer was solely responsible for causing deterioration of the resist composition, but as a result of intensive investigations, they discovered that deterioration over time of the stored novolak resin solution used for the preparation of the resists was causing fluctuations in the characteristics of the product between production lots.

It was not previously known that novolak resin deteriorates when stored as a novolak resin solution.

Furthermore, the above type of fluctuation between lots had also not been previously reported.

In other words, a novolak resin solution of the present invention is formed by adding benzoquinone to an organic solvent solution of a novolak resin.

Furthermore, a positive photoresist composition of the present invention comprises the novolak resin solution described above, and a photosensitive component.

Furthermore, a positive photoresist composition of the present invention comprises a novolak resin solution formed by dissolving a novolak resin in an organic solvent, a photosensitive component, and hydroquinone.

Furthermore, a method of producing a positive photoresist composition of the present invention involves mixing the novolak resin solution described above and a photosensitive component.

DETAILED DESCRIPTION OF THE PREFERRED EMBODIMENTS

There are no particular restrictions on the novolak resin used in the present invention, and novolak resins that are typically used as film forming materials in positive photoresist compositions can be used. Of these resins, novolak resins which offer superior developing characteristics, and dissolve readily in alkali solutions without swelling are preferred.

Novolak resins are typically produced by the condensation of a phenol and an aldehyde and/or a ketone in the presence of an acid catalyst.

Examples of the phenol used for forming a novolak resin include phenol, m-cresol, p-cresol, o-cresol, xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenyl phenol; arylphenols such as phenylphenol; and polyhydroxyphenols such as 4,4'-dihydroxybiphenyl, bisphenol A, resorcinol, hydroquinone and pyrogallol. These phenols may be used either singularly, or in combinations of two or more compounds. Of the above phenols, m-cresol, p-cresol, 2,5-xylenol, 3,5-xylenol and 2,3,5-trimethylxylenol are preferred.

Examples of the aldehyde mentioned above include formaldehyde, paraformaldehyde, trioxane, acetoaldehyde, propionaldehyde, butylaldehyde, trimethylacetoaldehyde, acrolein, crotonaldehyde, cyclohexanealdehyde, furfural, furylacrolein, benzaldehyde, terephthalaldehyde, phenylacetoaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamaldehyde. These aldehydes can be used either singularly, or in combinations of two or more compounds. Of the above aldehydes, formaldehyde is preferred in terms of ease of availability, although from the viewpoint of improving heat resistance, a combination of a hydroxybenzaldehyde and formaldehyde is preferred.

Examples of the ketone mentioned above include acetone, methyl ethyl ketone, diethyl ketone and diphenyl ketone. These ketones can be used either singularly, or in combinations of two or more compounds. Amongst the possible combinations of a phenol and a ketone, the combination of pyrogallol and acetone is particularly preferred.

Examples of acid catalysts which can be used in the condensation reaction between the phenol and the aldehyde include hydrochloric acid, sulfuric acid, formic acid, oxalic acid and paratoluenesulfonic acid.

The polystyrene equivalent weight average molecular weight of the novolak resin used in the present invention is preferably within a range from 2000 to 20,000.

In those cases in which the novolak resin is synthesized by a solution polymerization, the solution obtained by removing impurities such as unreacted reactants and catalyst from the reaction solution following completion of the solution polymerization, and in some cases also removing low molecular weight materials by a fractionation operation, can be used as the novolak resin solution of the present invention. In those cases in which the novolak resin is synthesized by bulk polymerization or the like and exists in a solid state, a solution produced by dissolving this resin in a solvent can be used as the novolak resin solution of the present invention. In some cases, low molecular weight materials can then be removed from the solution by a fractionation operation, and the resulting solution then used as the novolak resin solution.

The organic solvent used can be any solvent capable of dissolving the novolak resin.

Examples of suitable organic solvents include ketones such as acetone, methyl ethyl ketone, cyclohexanone, methyl isoamyl ketone and 2-heptanone; polyhydric alcohols and derivatives thereof such as ethylene glycol, propylene glycol, diethylene glycol, ethylene glycol monoacetate, propylene glycol monoacetate, diethylene glycol monoacetate, or the monomethyl ethers, monoethyl ethers, monopropyl ethers, monobutyl ethers or monophenyl ethers thereof, cyclic ethers such as dioxane; and esters such as ethyl lactate, methyl acetate, ethyl acetate, butyl acetate, methyl pyruvate, ethyl pyruvate and ethyl methoxypropionate. These solvents can be used either singularly, or in mixtures of two or more solvents.

There are no particular restrictions on the resin concentration of the final novolak resin solution, although when used for the purpose of preparing a resist, the resin concentration is typically within a range from 20 to 60 mass %, and preferably from 35 to 55 mass %.

A novolak resin solution of the present invention is obtained by adding benzoquinone to a novolak resin solution prepared in the manner described above. In order to avoid the problem of particle generation following preparation of the resist, the benzoquinone is preferably added using the type of method described below.

1. At room temperature (20 to 25° C.), sufficient benzoquinone is added to a sample of the same organic solvent as that used in the novolak resin solution, to produce a concentration of 10 to 20 mass %, and the mixture is then stirred for at least 10 minutes to form a uniform solution with the benzoquinone completely dissolved.

2. This solution is then added gradually to the novolak resin solution.

The quantity of benzoquinone added is preferably within a range from 1 to 20 g, and even more preferably from 3 to 10 g, per 1000 g of the novolak resin.

If the quantity of benzoquinone is less than the above range then the desired storage stability of the novolak resin solution is not adequately manifested, whereas if the quantity exceeds the above range, the characteristics of the resist composition tend to deteriorate.

A positive photoresist composition of the present invention comprises a novolak resin solution such as that described above and a photosensitive component. There are no particular restrictions on the photosensitive component used, and in those cases in which a chemically amplified resist composition is to be prepared, known PAG (photoacid generators) can be used, whereas in the case of a non-chemically amplified resist composition, products of quinonediazide esterifications can be used. In a positive photoresist composition of the present invention, non-chemical amplification type quinonediazide esterification products are preferred.

Examples of suitable quinonediazide esters include the compounds represented by a general formula (I) shown below.

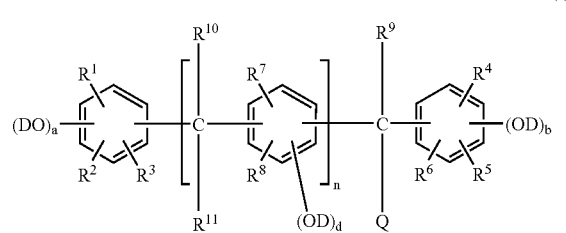

(I)

In the formula (I), $R^1$ to $R^8$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms, $R^9$ to $R^{11}$ each represent, independently, a hydrogen atom or an alkyl group of 1 to 6 carbon atoms, Q represents a hydrogen atom, an alkyl group of 1 to 6 carbon atoms, a cycloalkyl group of 3 to 6 carbon atoms combined with $R^9$, or a group represented by a chemical formula (II) shown below, a and b represent integers of 1 to 3, d and n represent integers of 0 to 3, each D represents, independently, a hydrogen atom or a 1,2-napthoquinonediazide-5-sulfonyl group, and at least one D group is a 1,2-napthoquinonediazide-5-sulfonyl group.

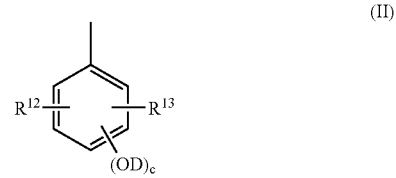

(II)

In the formula (II), $R^{12}$ and $R^{13}$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms, c represents an integer of 1 to 3, and D represents the same meaning as described above.

The quantity of the photosensitive component is within a range from 5 to 80 mass %, and preferably from 10 to 70 mass %, relative to the combined total of the novolak resin described above and the sensitivity improvement agent described below. If the quantity is less than 5 mass % then an image which is faithful to the pattern cannot be obtained, and the transferability deteriorates. In contrast, if the quantity of the photosensitive component exceeds 80 mass %, the sensitivity of the product photoresist composition deteriorates, and the uniformity of the resist film and the resolution also deteriorate.

An alkali soluble, low molecular weight compound with a phenolic hydroxyl group and a molecular weight of no more than 1000 can also be added as a component for improving the sensitivity of the photoresist composition. Hereafter this type of low molecular weight compound is termed a sensitivity improvement agent.

Adding this type of sensitivity improvement agent enables a higher sensitivity to be achieved, and also contributes to improved throughput. Furthermore, by adding a sensitivity improvement agent, a sparingly soluble layer is formed on the surface of the resist film, causing a reduction in the quantity of film thinning within the unexposed portions of the resist film during developing, and suppressing the occurrence of development irregularities arising from differences in developing time.

Examples of suitable sensitivity improvement agents include the phenol compounds represented by a general formula (III) shown below.

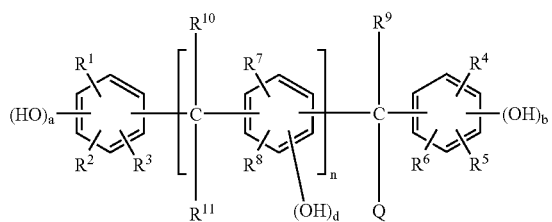

(III)

In the formula (III), $R^1$ to $R^8$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms, and $R^9$ to $R^{11}$ each represent, independently, a hydrogen atom or an alkyl group of 1 to 6 carbon atoms. Q represents a hydrogen atom, an alkyl group of 1 to 6 carbon atoms, a cycloalkyl group of 3 to 6 carbon atoms combined with $R^9$, or a group represented by a chemical formula (IV) shown below, a and b represent integers of 1 to 3, and d and n represent integers of 0 to 3.

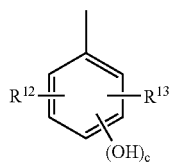

(IV)

In the formula (IV), $R^{12}$ and $R^{13}$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms, and c represents an integer of 1 to 3.

Specific examples of the phenol compound represented by the general formula (III) include tris(4-hydroxyphenyl) methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-2-hydroxyphenylmethane, bis(4-hydroxy-3,5-dimethylphenyl)-3-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-2,5-dimethylphenyl)-3-hydroxyphenylmethane, bis(4-hydroxy-2,5-dimethylphenyl)-4-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 2-(3-fluoro-4-hydroxyphenyl)-2-(3'-fluoro-4'-hydroxyphenyl)propane, 2-(2,4-dihydroxphenyl)-2-(4'-hydroxyphenyl) propane, 2-(2,3,4-trihydroxyphenyl)-2-(4'-hydroxyphenyl) propane, 2-(2,3,4-trihydroxyphenyl)-2-(4'-hydroxy-3',5'-dimethylphenyl)propane, bis(2,4-dihydroxyphenyl) methane, bis(2,3,4-trihydroxyphenyl)methane, 2,3,4-trihydroxyphenyl-4'-hydroxyphenylmethane, 1,1-di(4-hydroxyphenyl)cyclohexane and 2,4-bis[1-(4-hydroxyphenyl)isopropyl]-5-hydroxyphenol.

Of these compounds, bis(4-hydroxy-3-methylphenyl)-2-hydroxyphenylmethane, bis(4-hydroxy-2,3,5-trimethylphenyl)-2-hydroxyphenylmethane, 2,4-bis[1-(4-hydroxyphenyl)isopropyl]-5-hydroxyphenol, 1,1-di(4-hydroxyphenyl)cyclohexane and 1-[1-(4-hydroxyphenyl)isopropyl]-4-[1,1-bis(4-hydroxyphenyl)ethyl]benzene are preferred as they offer a superior sensitivity improvement effect, and 1-[1-(4-hydroxyphenyl)isopropyl]-4-[1,1-bis(4-hydroxyphenyl) ethyl]benzene and bis(4-hydroxy-2,3,5-trimethylphenyl)-2-hydroxyphenylmethane are particularly preferred from the viewpoints of improving sensitivity, residual film ratio and linearity.

The quantity of the sensitivity improvement agent is selected appropriately from within a range from 5 to 50 mass %, and preferably from 10 to 40 mass % based on the aforementioned novolak resin.

A positive photoresist composition of the present invention is preferably a novolak resin solution as described above, to which has been added a photosensitive component, and preferably also a sensitivity improvement agent, and where necessary, also a variety of other additives.

Ultraviolet absorbing agents for preventing halation and surfactants for preventing striation may also be added to a positive photoresist composition of the present invention, provided their addition does not impair the effects of the present invention.

Examples of suitable ultraviolet absorbing agents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylaminoazobenzene, 4-diethylamino-4'-ethoxyazobenzene and curcumin. Examples of suitable surfactants include fluorine based surfactants such as FLUORAD FC-430 and FLUORAD FC-431 (brand names, manufactured by Sumitomo 3M Co., Ltd.), and EF122A, EF122B, EF122C and EF126 from the EFTOP series (brand names, manufactured by Jemco Inc.).

In addition, where necessary other general purpose additives such as additional resins, plasticizers, stabilizers and contrast improvement agents can also be added, provided their addition does not impair the effects of the present invention.

A method of producing a positive photoresist composition of the present invention is a method in which a photosensitive component is added to a novolak resin solution of the present invention, and sensitivity improvement agents, ultraviolet absorbing agents and surfactants are added where necessary, and additional solvent is then added where necessary to adjust the concentration and generate a uniform solution. This additional solvent can utilize the same solvents described above as suitable solvents for the novolak resin solution. The solvent added may be either the same as, or different from, the solvent used in the novolak resin solution. Furthermore, the product solution may also be filtered through a membrane filter or the like.

The benzoquinone in the novolak resin solution of the present invention undergoes reduction on storage of the novolak resin solution, and is gradually converted to hydroquinone.

Rather surprisingly, by simply preparing a novolak resin solution by adding the required quantity of benzoquinone to ensure a stable novolak resin solution, and then producing a positive photoresist composition using that novolak resin solution, a stable positive photoresist composition is obtained. In other words, there is no necessity to add additional benzoquinone or additional stabilizers for the photosensitive component added to the novolak resin solution during production of the photoresist composition.

In this manner, one of the significant effects of the present invention is that by maintaining the storage stability of the novolak resin solution, the storage stability of a positive photoresist composition using this novolak resin solution can also be ensured.

Accordingly, a positive photoresist composition prepared by using a novolak resin solution of the present invention frequently contains hydroquinone formed by the reduction of benzoquinone. There is no need to actively add hydroquinone to the positive photoresist composition. In other words, a positive photoresist composition containing hydroquinone can be obtained using a novolak resin solution according to the present invention, and represents a positive photoresist composition of the present invention which can be obtained using a method of producing a positive photoresist composition according to the present invention.

EXAMPLES

As follows is a more detailed description of the present invention based on a series of examples.

The variation over time of the novolak resin solutions and the resist compositions were evaluated in the manner described below.

(1) Evaluation of Variation over Time of a Novolak Resin Solution

A novolak resin solution prepared in one of the synthetic examples described below was applied to a substrate immediately following synthesis or preparation of the solution, and was then dried for 90 seconds at 110° C., forming a film of thickness 1 μm. The time taken ($T_0$ (s)) to completely dissolve this film at 23° C. in a 2.38 mass % aqueous solution of tetramethylammonium hydroxide (TMAH) was then determined.

Subsequently, the novolak resin solution was placed in a vessel filled with an inert gas (nitrogen gas) and stored in a darkroom for 90 days at 40° C., and was then applied to a substrate and dried for 90 seconds at 110° C., forming a film of thickness 1 μm. The time taken ($T_n$ (s)) to completely dissolve this film at 23° C. in a 2.38 mass % aqueous solution of tetramethylammonium hydroxide (TMAH) was then determined, and the absolute value of the difference between the two values $T_0$ (s) and $T_n$ (s), that is $|T_n-T_0|$, was recorded as the degree of variation over time of the novolak resin solution.

(2) Evaluation of Variation over Time of a Resist Composition

The sensitivity ($Eop_0$ (ms)) of a resist composition produced using a novolak resin solution that had been freshly prepared was determined.

Subsequently, the resist composition was placed in a vessel filled with an inert gas (nitrogen gas) and stored in a darkroom for 90 days at 40° C., and the sensitivity of the resist composition following storage ($Eop_p$ (ms)) was determined. The absolute value of the difference between the two values $Eop_0$ (ms) and $Eop_p$ (ms), that is $|Eop_p-Eop_0|$, was recorded as the degree of variation over time of the resist composition.

The sensitivity values described above were determined in the manner described below.

The resist composition was applied to the surface of a silicon wafer using a spinner and then dried for 90 seconds at 90° C. on a hotplate, forming a resist film with a film thickness of 1.05 μm. The film was then exposed for a period from 0.1 seconds to 0.01 seconds through a mask (reticle) for a 1:1 line and space 0.35 μm resist pattern, using a reduction projection exposure apparatus NSR 2005i10D (manufactured by Nikon Corporation, NA=0.57), subjected to post exposure baking (PEB) for 90 seconds at 110° C., subsequently developed for 60 seconds at 23° C. in a 2.38 mass % TMAH aqueous solution, and then washed with water for 30 seconds and dried. The optimum exposure time (Eop) at which the line and space widths of the 0.35 μm resist pattern were formed in a 1:1 ratio was recorded as the sensitivity, using units of milliseconds (ms).

(3) Evaluation of Fluctuation between Resist Composition Lots

The sensitivity ($Eop_0$ (ms)) of a resist composition produced using a novolak resin solution that had been freshly prepared was determined.

Subsequently, a novolak resin solution sample was placed in a vessel filled with an inert gas (nitrogen gas) and stored in a darkroom for 90 days at 40° C., and the sensitivity ($Eop_n$ (ms)) of a resist composition produced using this stored novolak resin solution was determined. The absolute value of the difference between the two values $Eop_0$ (ms) and $Eop_n$ (ms), that is $|Eop_n-Eop_0|$, was recorded as the degree of fluctuation between lots of the resist composition.

The sensitivity values described above were determined in the same manner as described in the evaluation section (2) above.

Synthetic Example 1

Synthesis of a Novolak Resin 1 m-cresol, p-cresol and 2,5-xylenol were mixed together in a molar ratio of 4:4:2, and using oxalic acid as an acid catalyst, and formaldehyde and salicylaldehyde as condensing agents, a condensation reaction was conducted using normal methods, resulting in the synthesis of a novolak resin.

The low molecular weight fraction of the thus obtained novolak resin was removed, yielding an alkali soluble novolak resin with a polystyrene equivalent weight average molecular weight (Mw) of 7000.

Subsequently, this novolak resin was dissolved in methyl amyl ketone (hereafter abbreviated as MAK) to prepare a novolak resin solution 1a with a resin concentration of 50 mass %.

In addition, 2 g of benzoquinone was added to 1000 g of this novolak resin solution 1a to prepare another novolak resin solution 1b.

Synthetic Example 2

Synthesis of a Novolak Resin 2

2,6-dimethylol-p-cresol was dissolved in a mixed solvent of γ-butyrolactone/methanol (mass ratio=4/1) to prepare a solution A with a concentration of 6.5 mass %.

In addition, 2,5-xylenol and sodium hydroxide were mixed together in a molar ratio of 4:1, and a condensation reaction was conducted using formaldehyde as the condensing agent. Following completion of the reaction, recrystallization was used to obtain crystals of bis(2,5-dimethyl-4-hydroxyphenyl)methane.

The crystals of bis(2,5-dimethyl-4-hydroxyphenyl)methane were then dissolved in γ-butyrolactone to prepare a solution B with a concentration of 30 mass %.

5 g of p-toluenesulfonic acid was added as a catalyst to 1000 g of the solution B, and 40 g of the aforementioned solution A was then added dropwise to effect a condensation reaction.

Analysis revealed that the solution obtained at the completion of the reaction contained a low molecular weight novolak resin of Mw=1456.

2.5 mols of m-cresol was added to the solution obtained at the completion of the above reaction, and using formaldehyde as the condensing agent, a condensation reaction was conducted using normal methods, resulting in the synthesis of a novolak resin.

The low molecular weight fraction of the thus obtained novolak resin was removed, yielding a high ortho alkali soluble novolak resin with an ortho-ortho bonding ratio of 53% and Mw=7700.

Subsequently, this novolak resin was dissolved in MAK to prepare a novolak resin solution 2a with a resin concentration of 50 mass %.

In addition, 2 g of benzoquinone was added to 1000 g of this novolak resin solution 2a to prepare another novolak resin solution 2b.

Synthetic Example 3

Synthesis of a Novolak Resin 3 m-cresol, and 3,4-xylenol were mixed together in a molar ratio of 4:1, and using p-toluenesulfonic acid as an acid catalyst, and formaldehyde as a condensing agent, a condensation reaction was conducted using normal methods, resulting in the synthesis of an alkali soluble novolak resin with Mw=2900.

Subsequently, this novolak resin was dissolved in MAK to prepare a novolak resin solution 3a with a resin concentration of 50 mass %.

In addition, 2 g of benzoquinone was added to 1000 g of this novolak resin solution 3a to prepare another novolak resin solution 3b.

(4) Measurement of Benzoquinone and Hydroquinone Content within a Novolak Resin Solution (i) 0.5 mass % test solutions were prepared using freshly prepared or synthesized samples of the novolak resin solutions 1b to 3b from the synthetic examples 1 to 3 described above.

(ii) 0.5 mass % test solutions were also prepared using samples of the novolak resin solutions 1b' to 3b' produced by placing freshly prepared or synthesized samples of each of the novolak resin solutions 1b to 3b from the synthetic examples 1 to 3 in a vessel filled with an inert gas (nitrogen gas), and then storing the solution in a darkroom for 90 days at 40° C.

(iii) An eluting solvent of water/acetonitrile (mass ratio=6/4) was passed through a column (product name: "Inertsil ODS-2", manufactured by GL Sciences Ltd.) for 10 minutes at a flow rate of 0.7 ml/min. Using an oven, the column temperature was set to a temperature of 45° C.

(iv) 1.0 μl of each of the above test samples was injected into a reverse phase HPLC (high performance liquid chromatography) device (brand name: "HP-1100", manufactured by Agilent Ltd.), and using a measurement wavelength in the vicinity of 230 nm, the ratio between the peak surface area of benzoquinone (BQ), which was detected at an elution time of 3.4 to 4.0 minutes, and the peak surface area of hydroquinone (HQ), which was detected at an elution time of 2.4 to 3.0 minutes was determined. The results are shown in Table 1.

TABLE 1

| Novolak resin solution | BQ:HQ |
|---|---|
| 1b | 0.15:0.03 |
| 1b' | 0.00:0.06 |
| 2b | 0.12:0.04 |
| 2b' | 0.01:0.16 |
| 3b | 0.11:0.04 |
| 3b' | 0.01:0.15 |

As is evident from the above results, the BQ within each novolak resin solution had been converted almost entirely into HQ following placement of the novolak resin solution in a vessel filled with an inert gas (nitrogen gas) and then storage of the solution in a darkroom for 90 days at 40° C.

Example 1

An evaluation of each of the aforementioned novolak resin solutions 1a to 3a, and 1b to 3b was conducted in accordance with the evaluation (1) described above. The results are shown in Table 2.

Example 2

Using each of the novolak resin solutions 1a to 3a, and 1b to 3b described above, resist compositions were prepared in the following manner.

(A) 100 parts by mass of the novolak resin (the equivalent of 200 parts by mass of the novolak resin solution)

(B) 30 parts by mass of a photosensitive component (a mixture of B1 and B2 described below)

(B1/B2=3/2 (mass ratio))

B1: The product of an esterification reaction between 1 mol of bis[2,5-dimethyl-3-(2-hydroxy-5-methylbenzyl)-4-hydroxyphenyl]methane, and 2 mols of 1,2-naphthoquinonediazide-5-sulfonyl chloride (hereafter abbreviated as 5-NQD).

B2: The product of an esterification reaction between 1 mol of bis(3,5-dimethyl-4-hydroxyphenyl)-3,4-dihydroxyphenylmethane and 2 mols of 5-NQD.

(C) 27 parts by mass of a sensitivity improvement agent (a mixture of C1 and C2 described below)

(C1/C2=1/1 (mass ratio))

C1: 1-[1-(4-hydroxyphenyl)isopropyl]-4-[1,1-bis(4-hydroxyphenyl)ethyl]benzene

C2: bis(4-hydroxy-2,3,5-trimethylphenyl)-2-hydroxyphenylmethane (D) Other components (the compound D described below) totaling 2 mass % based on the combined mass of the components (A) to (C)

D: 1,4-bis[1-(2-methyl-4-hydroxy-5-cyclohexylphenyl)isopropyl]benzene

The components (A) to (D) listed above were dissolved in 450 parts by mass of 2-heptanone, and then filtered through a membrane filter with a pore diameter of 0.2 μm to form a positive photoresist composition.

The physical properties, described in the evaluation sections (2) and (3) above, for each of these photoresist compositions are shown in Table 2.

TABLE 2

| Synthetic Example No. | 1 | | 2 | | 3 | |
|---|---|---|---|---|---|---|
| Novolak resin solution | 1a | 1b | 2a | 2b | 3a | 3b |
| $T_0$ (s) | 39.2 | 38.8 | 42.7 | 40.5 | 3.0 | 2.8 |
| $T_n$ (s) | 49.9 | 41.0 | 46.8 | 39.1 | 3.7 | 3.0 |
| (1) Variation over time of novolak resin solution | 10.7 | 2.2 | 4.1 | 1.4 | 0.7 | 0.2 |
| $Eop_0$ (ms) | 370 | 365 | 380 | 370 | 150 | 140 |
| $Eop_p$ (ms) | 405 | 375 | 390 | 370 | 155 | 140 |
| $Eop_n$ (ms) | 415 | 385 | 395 | 375 | 150 | 140 |
| (2) Variation over time of a resist composition | 35 | 10 | 10 | 0 | 5 | 0 |
| (3) Degree of fluctuation between resin composition lots | 45 | 20 | 15 | 5 | 0 | 0 |

As is evident from the results shown above, the novolak resin solutions 1b to 3b containing added benzoquinone displayed less variation over time of the novolak resin solution than the novolak resin solutions 1a to 3a containing no added benzoquinone.

Furthermore, it is also evident that the resin compositions prepared using the novolak resin solutions 1b to 3b containing added benzoquinone displayed less fluctuation between resin composition lots than the resin compositions prepared using the novolak resin solutions 1a to 3a containing no added benzoquinone.

In addition, from the observation that the sensitivity of the resin compositions prepared using freshly prepared samples of the novolak resin solutions 1b to 3b, and the sensitivity of the resin compositions prepared using samples of the same novolak resin solutions 1b to 3b which had been placed in a vessel filled with an inert gas (nitrogen gas) and then stored in a darkroom for 90 days at 40° C. were substantially equal, it is apparent that the resin compositions display little fluctuation between lots.

As described above, a novolak resin solution of the present invention displays little variation over time, and a positive resist composition produced using such a novolak resin solution offers the advantage of displaying little fluctuation between different production lots produced during the storage period of the novolak resin.

What is claimed is:

1. A positive photoresist composition comprising a novolak resin solution formed by dissolving a novolak resin in an organic solvent, a photosensitive component, and hydroquinone.

2. A positive photoresist composition according to claim 1, wherein said photosensitive component is a product of a quinonediazide esterification.

3. A positive photoresist composition according to claim 1, further comprising an alkali soluble, low molecular weight compound with a phenolic hydroxyl group and a molecular weight of no more than 1000.

* * * * *